(12) United States Patent
Gurumani et al.

(10) Patent No.: US 12,328,132 B2
(45) Date of Patent: Jun. 10, 2025

(54) EXTERNAL DIGITAL PRE-DISTORTER COEFFICIENT COMPUTATION FOR POWER AMPLIFIER NONLINEARITY COMPENSATION

(71) Applicant: Hughes Network Systems, LLC, Germantown, MD (US)

(72) Inventors: Santharam Gurumani, Frederick, MD (US); Prachi Raikar, Columbia, MD (US); Bala Subramaniam, Potomac, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 49 days.

(21) Appl. No.: 18/050,735

(22) Filed: Oct. 28, 2022

(65) Prior Publication Data

US 2024/0146343 A1    May 2, 2024

(51) Int. Cl.
  *H04B 1/04*    (2006.01)
  *H04B 17/336*    (2015.01)

(52) U.S. Cl.
  CPC ............. *H04B 1/04* (2013.01); *H04B 17/336* (2015.01); *H04B 2001/0425* (2013.01)

(58) Field of Classification Search
  CPC .......... H04B 1/0475; H04B 2001/0425; H03F 1/3247; H03F 3/245
  See application file for complete search history.

(56) References Cited

U.S. PATENT DOCUMENTS

| | | | |
|---|---|---|---|
| 10,425,099 B1 * | 9/2019 | Aouini | ................. H03M 3/50 |
| 2012/0321018 A1 * | 12/2012 | Chen | ................. H03F 1/3241 |
| | | | 375/296 |

(Continued)

FOREIGN PATENT DOCUMENTS

| | | |
|---|---|---|
| EP | 2237512 A1 | 10/2010 |
| WO | 2007044957 A2 | 4/2007 |

OTHER PUBLICATIONS

Abdelrahman et al ("A Novel Weighted Memory Polynomial for Behavioral Modeling and Digital Predistortion of Nonlinear Wireless Transmitters", IEEE Transactions on Industrial Electronics, vol. 63, No. 3, Mar. 2016 (Year: 2016).*

Gharaibeh et al ("Accurate Estimation of Digital Communication System Metrics—SNR, EVM and p in a Nonlinear Amplifier Environment", North Carolina State University, IEEE, 2005) (Year: 2005).*

(Continued)

*Primary Examiner* — Aristocratis Fotakis
(74) *Attorney, Agent, or Firm* — Kilpatrick Townsend & Stockton LLP

(57) ABSTRACT

Digital pre-distorter (DPD) coefficients can be used to compensate for non-linearity of a power amplifier (PA). A system can receive a defined waveform from transmit hardware. The system can transmit an output waveform with a defined modulation from the PA. The system can capture samples of the output waveform. The system can submit the samples to a processing system temporarily connected to a transmitter system. The system can compute a PA model using the defined waveform and the samples. The system can determine a plurality of Digital Pre-Distorter (DPD) coefficients for a plurality of power levels, frequencies, and temperatures based on the PA model. The system can store the plurality of DPD coefficients to a memory of the transmitter system. Additionally, the system can add predistortions using the plurality of DPD coefficients to a plurality of input waveforms to correct for impairments introduced by the PA.

20 Claims, 6 Drawing Sheets

(56) References Cited

U.S. PATENT DOCUMENTS

| | | | |
|---|---|---|---|
| 2013/0052960 A1 | 2/2013 | Do | |
| 2014/0133531 A1* | 5/2014 | Nguyen | H03G 3/3042 |
| | | | 375/219 |
| 2017/0126258 A1* | 5/2017 | Subrahmaniyan Radhakrishnan | H04B 1/0475 |
| 2018/0006616 A1* | 1/2018 | Avivi | H03F 1/3252 |
| 2019/0215023 A1* | 7/2019 | Abouelenin | H03F 3/245 |
| 2019/0312649 A1 | 10/2019 | Spyropoulos et al. | |
| 2020/0103485 A1* | 4/2020 | Anderson | H04B 17/21 |
| 2021/0203369 A1* | 7/2021 | Kasargod | H04B 1/0475 |
| 2023/0268942 A1* | 8/2023 | Ghannouchi | H04B 10/00 |
| | | | 375/297 |

OTHER PUBLICATIONS

Pablo Wilke Berenguer, Markus Nolle, Lutz Molle, Talha Raman, Antonio Napoli, Colja Schubert, and Johannes Karl Fischer, "Nonlinear Digital Pre-Distortion of Transmitter Components", Journal of Lightwave Technology, vol. 34, No. 8, Apr. 15, 2016 (Year: 2016).*

Application No. PCT/US2023/034611, International Search Report and the Written Opinion, mailed on Feb. 19, 2024, 17 pages.

* cited by examiner

EXTERNAL DIGITAL PRE-DISTORTER COEFFICIENT COMPUTATION FOR POWER AMPLIFIER NONLINEARITY COMPENSATION

BACKGROUND

Power amplifiers (PA) can be used in a communication system to boost a transmit signal power. When a PA is operated close to a maximum power or saturation point, a modulated transmit signal can be distorted due to nonlinear characteristics of the PA and, thus, signal quality can be reduced. Distortion can be greater for higher order modulations of an input signal. Addressing the distortion solely within the transmit system can add complexity and cost to the transmit system.

SUMMARY

Techniques are provided (e.g., a method, a system, a non-transitory, computer-readable medium storing code or instructions executable by one or more processors) for designing and implementing external digital pre-distorter coefficient computation for power amplifier nonlinearity compensation. Various embodiments are described herein, including methods, systems, non-transitory, computer-readable storage media storing programs, code, or instructions executable by one or more processors, and the like.

One embodiment is directed to a method for predistorting an input to a power amplifier (PA) that includes receiving, at the PA of a transmitter system, a defined waveform, wherein the defined waveform has a defined transmit frequency and a defined power level, outputting, by the PA, an output waveform with a defined modulation, capturing, by a calibration system, a plurality of samples of the output waveform from the PA at ambient temperature, wherein the calibration system is temporarily connected with the transmitter system, calculating, by the calibration system, a PA model based on the defined waveform and the plurality of samples, determining, by the calibration system, a plurality of digital pre-distorter (DPD) coefficients for a plurality of power levels, frequencies, and temperatures based on the PA model, storing, by the transmitter system, the plurality of DPD coefficients, and after disconnecting the calibration system, modifying, by the transmit hardware of the transmitter system, a plurality of input waveforms using the plurality of DPD coefficients to create a predistorted waveform for input to the PA.

In some embodiments, a system is provided that includes one or more data processors and a non-transitory, computer-readable storage medium containing instructions which, when executed on the one or more data processors, cause the one or more data processors to perform part or all of one or more methods disclosed herein.

In some embodiments, a computer-program product is provided that is tangibly embodied in a non-transitory, machine-readable storage medium and that includes instructions configured to cause one or more data processors to perform part or all of one or more methods disclosed herein.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments detailed herein are directed to an open loop transmitter system that implements an offline procedure for determining digital pre-distorter (DPD) coefficients that can be used to address a distortion in a modulated transmit signal due to nonlinear characteristics of a PA. In the transmitter system, a predetermined waveform with higher order modulation operating at an input power near a saturation point can be passed through the PA of the transmitter system. Output samples of the PA can be captured after down conversion in a calibration system external to the transmitter system. One or more processors in the calibration system can develop a PA model based on the predetermined waveform and the captured output samples. The PA model can be a computational model that describes nonlinearity of the PA by determining input amplitude to output amplitude (AM-AM) and input amplitude to output phase (AM-PM) characteristic curves for all operating points associated with the PA. An operating point for the PA can be a predefined power level and transmission frequency of a waveform as the waveform enters the PA.

DPD coefficients can be computed in an offline procedure using the PA model. The offline procedure can be a calibration procedure implemented prior to completing a manufacture of a transmitter system. The DPD coefficients can be independent of the modulation and can be computed for various input power levels. The PA model and/or the DPD coefficients can be transmitted from the one or more processors in the calibration system to the transmitter system for storage in a memory and for subsequent use in predistorting input waveforms provided to a PA. The predistortion compensates for the distortion introduced by the PA; therefore, with predistortion, the PA amplifies in a more linear manner and, possibly, distorts phase less. Once the calibration system has been used to compute the PA model and/or DPD coefficients, the calibration system can be physically disconnected and the transmitter system can be deployed in the field, such as for use in a satellite communication system.

The offline procedure for determining the PA model and DPD coefficients can then be repeated for many additional transmitter systems using the same calibration system. In some embodiments, the one or more processors of the transmitter system can determine the DPD coefficients using the PA model created by the calibration system.

The open loop design of the transmitter system can eliminate the need for an observation path in the transmitter system, reducing the number of hardware components, circuit complexity and/or cost. For example, frequency downconvert and ADC hardware components that can be found in closed loop systems may not be necessary in the arrangements detailed herein. The offline procedure detailed herein can determine DPD coefficients at different operating points and the coefficients can be stored, such as in memory, by the transmitter system.

Figure 1:
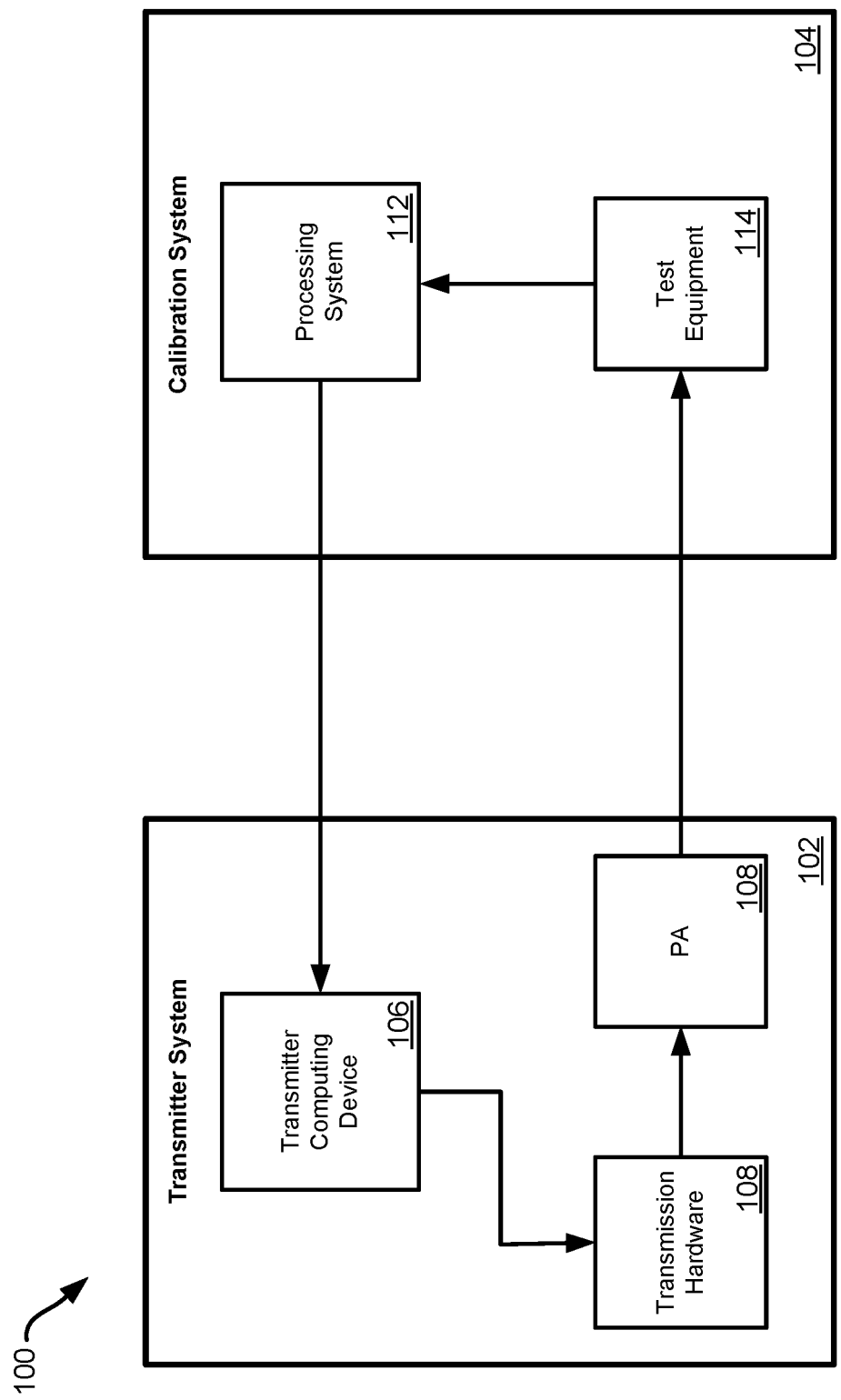
FIG. 1 is an embodiment of an open loop system that uses an offline procedure to determine digital pre-distorter (DPD) coefficients to compensate for PA nonlinearity.

FIG. 1 is a schematic of an open loop transmitter manufacturing environment 100 involving a transmitter system 102 that implements an offline procedure to determine DPD coefficients to compensate for PA nonlinearity according to various embodiments. The open loop transmitter manufacturing environment 100 can include the transmitter system 102 and a calibration system 104 external to the transmitter system 102. The transmitter system 102 can include a transmitter computing device 106, transmission hardware 108, and a PA 110. The calibration system 104 can include a processing system 112 and test equipment 114.

Figure 2:
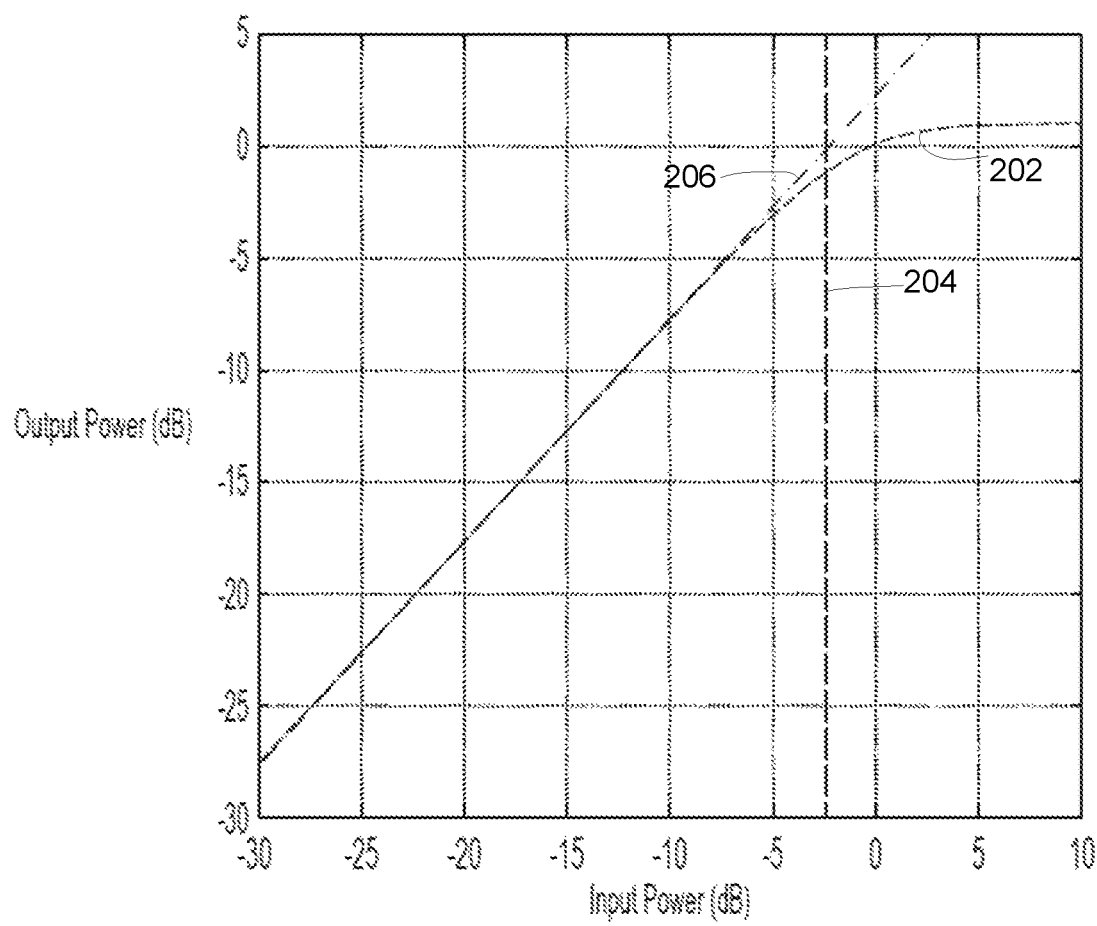
FIG. 2 is a graph of output power versus input power for an example PA.

The transmission hardware 108 is configured to transmit a defined waveform with a defined transmit frequency and a defined power level. The PA 110 can receive the defined waveform from the transmission hardware 108. The PA 110 can transmit an output waveform with a defined modulation. The test equipment 114 can receive the output waveform and capture samples from the output waveform. The captured samples can be transmitted by the test equipment 114 to the processing system 112 of the calibration system 104. The processing system 112 can compute a PA model using the defined waveform and the samples received from the test equipment 114. The PA model can describe nonlinear characteristics of the PA 110 by determining AM-AM and AM-PM characteristic curves associated with the PA 110. An example of an AM-AM curve is shown in FIG. 2 and an example of an AM-PM curve can be seen in FIG. 3. Notably, calibration system 104 can be temporarily connected with transmitter system 102 then disconnected. Once calibration system 104 has been used to create a PA model, DPD coefficients, or both, the data is loaded to transmitter system 102 and calibration system 104 can be (permanently) disconnected.

FIG. 2 is a graph 200 of output power versus input power for an example PA 110. The graph 200 includes an AM-AM characteristic curve 202. The AM-AM characteristic curve 202 exhibits linear behavior for input power values below a boundary value 204. A linear fit 206 to this portion of the AM-AM characteristic curve 202 is included in the graph 200. For values of the input power above the boundary value 204, the AM-AM characteristic curve 202 deviates from the linear fit 206. Therefore, the PA used to produce graph 200 would benefit from predistortion of its input to permit the PA to amplify closer to a linear relationship at input power levels above −7 dB.

Figure 3:
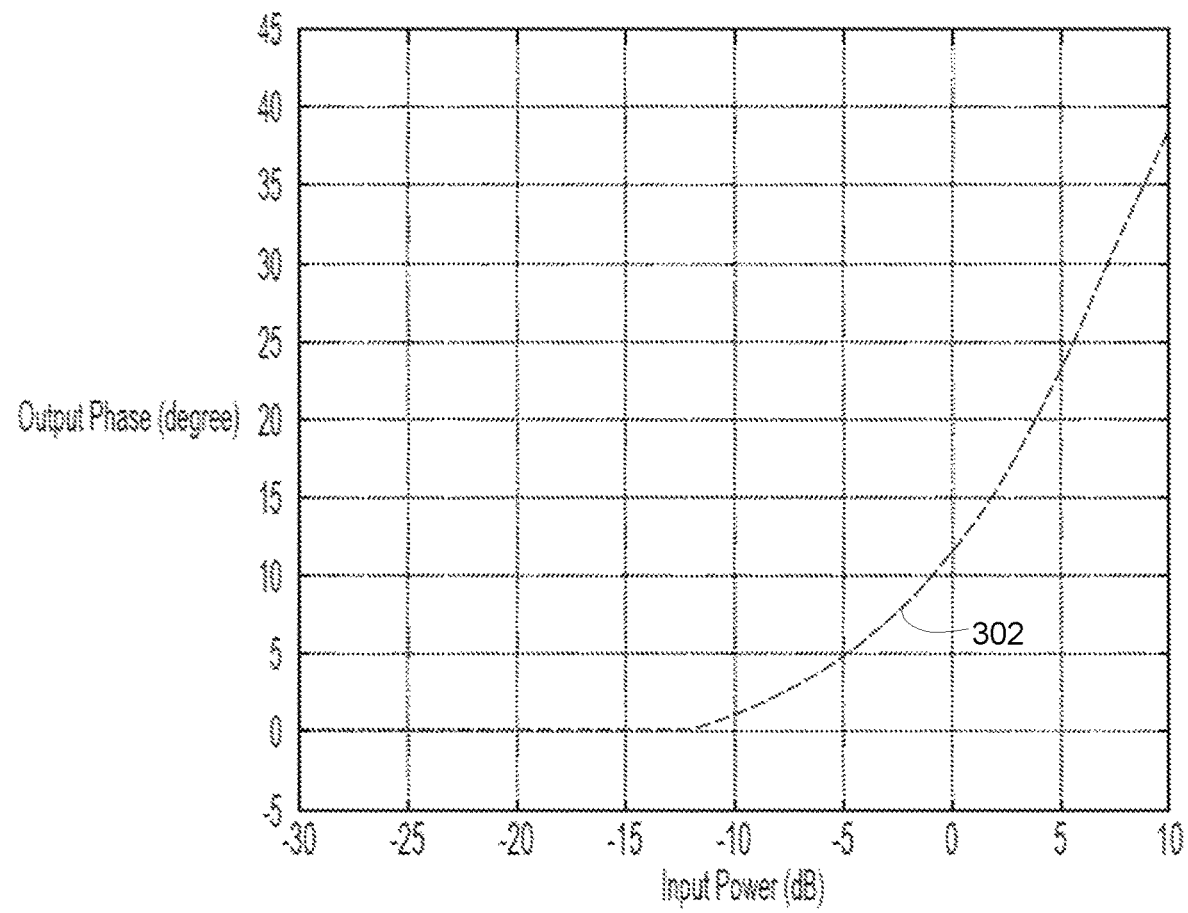
FIG. 3 is a graph of output phase versus input power for an example PA.

FIG. 3 is a graph 300 of output phase versus input power for an example PA 110. The graph 300 includes an AM-PM characteristic curve 302. For input power values below about −12 dB, the AM-PM characteristic curve 302 indicates that the output phase is zero. When the output phase is zero, there is no phase difference between an input signal (or waveform) and an output signal. For input power values above about −12 dB, the output phase is non-zero and there is a phase difference between the input signal and the output signal. In this portion of the graph 300, as the input power is increased, the phase difference increases in a non-linear fashion. Therefore, the PA used to produce graph 300 would benefit from predistortion of its input to permit the PA to amplify with less phase distortion at input power levels above −12 dB.

Referring back to FIG. 1, the processing system 112 can execute a program to run a simulation using the PA model to generate DPD coefficients for waveforms having a plurality of input power levels and input transmit frequencies. The DPD coefficients can be sent from the processing system 112 to the transmitter system 102 and stored in the transmitter computing device 106. In some examples, the processing system 112 can connect to the transmitter system 102 through a Multimedia over Coax Alliance (MOCA) or ethernet interface. Other wired and wireless communication arrangements can be used in various embodiments. The transmission hardware 108 can apply the DPD coefficients to add digital predistortions to input waveforms to correct for impairments that the PA 110 introduces to transmitted signals. The processing system 112 can be disengaged from the transmitter system 102 prior to adding the digital predistortions. In some examples, the PA model can be transmitted from the processing system 112 to the transmitter system 102 and the DPD coefficients can be determined using one or more of several processors in the transmitter computing device 106.

Figure 4:
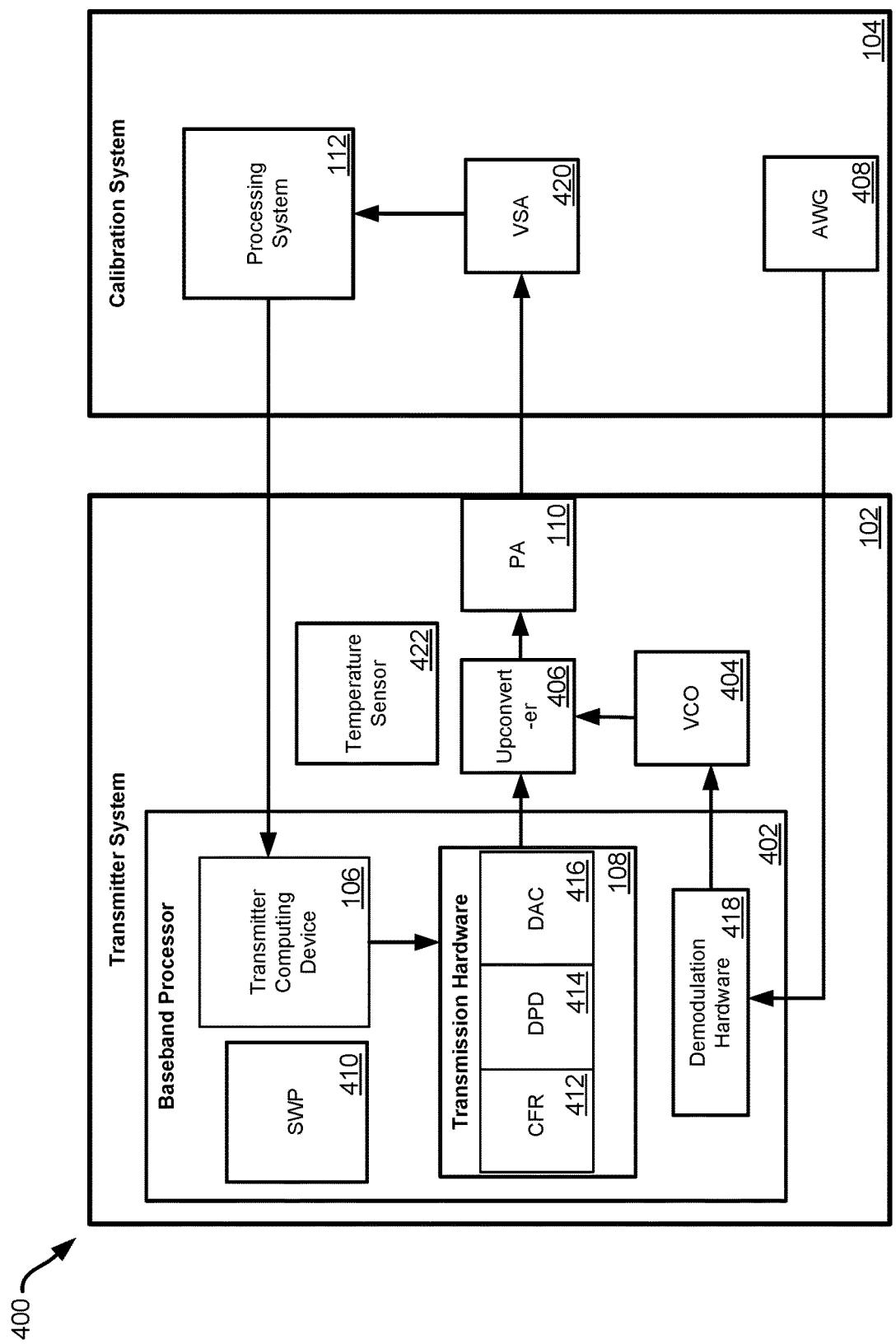
FIG. 4 is an embodiment of an open loop system that implements an offline procedure to determine DPD coefficients to compensate for PA nonlinearity.

FIG. 4 illustrates a detailed embodiment of an open loop transmitter manufacturing environment 400 involving a transmitter system 102 that implements an offline procedure to determine DPD coefficients to compensate for PA nonlinearity according to various embodiments. The open loop transmitter manufacturing environment 400 can include the transmitter system 102 and a calibration system 104 external to the transmitter system 102. The transmitter system 102 can include a baseband processor 402, a PA 110, an upconverter 406, a temperature sensor 422, and a voltage-controlled oscillator (VCO) 404. The calibration system 104 can include a vector signal analyzer (VSA) 420, a processing system 112 that can communicate with the VSA 420, and an arbitrary waveform generator (AWG) 408. The baseband processor 402 can include a single wire protocol (SWP) interface 410, a transmitter computing device 106, transmission hardware 108, and demodulation hardware 418. The transmission hardware 108 can include a crest factor reducer (CFR) 412, a digital pre-distorter (DPD) 414, and a digital to analog converter (DAC) 416. The DPD 414 can operate in two modes: an active mode and a bypass mode.

The transmission hardware 108 is configured to transmit an analog baseband signal. The upconverter 406 can receive and upconvert the analog baseband signal from baseband to a Ka band frequency. The baseband processor 402 can transmit control commands to the upconverter to configure analog gain and adjust power of the input signal before the input signal is received by the PA 110. The PA 110 can be connected to the VSA 420. The VSA 420 can capture digital samples of Ka band output from the PA 110.

The processing system 112 can send commands to the VSA 420 to capture the digital samples and collect other signal quality information. The VSA 420 can analyze transmit signal quality and adjacent channel interference (ACI) levels. The VSA 420 can report results of the analysis to the processing system 112. In some examples, the processing system 112 can connect to the transmitter system 102 through a Multimedia over Coax Alliance (MOCA) or ethernet interface to configure the transmission hardware 108 of the baseband processor 402. The demodulation hardware 418 of the baseband processor 402 can connect to the AWG 408 and lock on to a predetermined reference signal from the AWG 408. The VCO 404, as part of a frequency locked loop (FLL), can correct for any frequency drift between transmitted signals and the reference signal.

In some examples of an offline procedure, the transmission hardware 108 can transmit a defined waveform at a specified transmit frequency as part of an initial step. The DPD 414 can be set in bypass mode during the initial step. An operating point can be identified. In some examples, the defined waveform can be modulated to achieve a specified in-band signal quality and adjacent channel power ratio (ACPR). The in-band signal quality can be specified using signal to noise ratio (SNR) or error vector magnitude (EVM). An ACPR value can indicate an amount of ACI due to high transmit power in a specified channel. The operating point can be defined by an input frequency and input power of a modulated waveform when the modulated waveform reaches the PA 110. In some examples, the modulated waveform is a 16APSK modulated waveform with a specified peak to average signal ratio to assist in an identification of nonlinearity near the defined operating point.

A burst waveform, which is a waveform with a specified number of cycles, with a predetermined modulation at the operating point can be transmitted through the PA 110. The VSA 420 can down convert to baseband and capture digital samples from an output from the PA 110. In some examples, an IQ ("in-phase" and "quadrature") analyzer can capture the baseband digital samples from the output of the PA 110. The processing system 112 can send a command to the baseband processor 402 to begin the transmission of the burst waveform and the processing system 112 can trigger the VSA 420 to capture the baseband digital samples. The trigger can be based on a sensed power level in the VSA 420.

The processing system 112 can execute a program to compute a PA model by determining AM-AM and AM-PM curves based at least in part on the defined waveform and the baseband digital samples. The processing system 112 can execute another program to run a simulation using the PA model to generate DPD coefficients for a plurality of operating points. The DPD coefficients can be sent to the transmitter system 102 and the DPD 414 (when set to active mode) can apply the DPD coefficients to add digital predistortions to input waveforms to correct for impairments that the PA 110 introduces to transmitted signals. In some examples, the PA model can be transmitted to the transmitter system 102 and the DPD coefficients can be determined using one or more of the several processors in the transmitter computing device 106 ofthe baseband processor 402.

While in active mode, the DPD 414 can apply the DPD coefficients to a plurality of specified waveforms with defined transmit frequencies and transmit powers. The DPD 414 can add digital predistortions to the plurality of specified waveforms based on the DPD coefficients. The plurality of specified waveforms can be modulated and passed through the PA 110. In-band signal quality, SNR, and ACPR can be measured from output waveforms from the PA 110 associated with the plurality of specified waveforms. The measured in-band signal quality and ACPR values can be compared to corresponding values (bypass SNR values and bypass ACPR values of bypass output waveforms) measured when the DPD 414 is in bypass mode. While in bypass mode, the DPD 414 does not add digital predistortions to waveforms. The applied digital predistortions can provide improvements in in-band signal quality and ACPR. Components of the calibration system 104 can be disengaged from the transmitter system 102, but after disengagement, the transmitter system 102 continues to use the DPD coefficients obtained from the calibration system 104.

Figure 5:
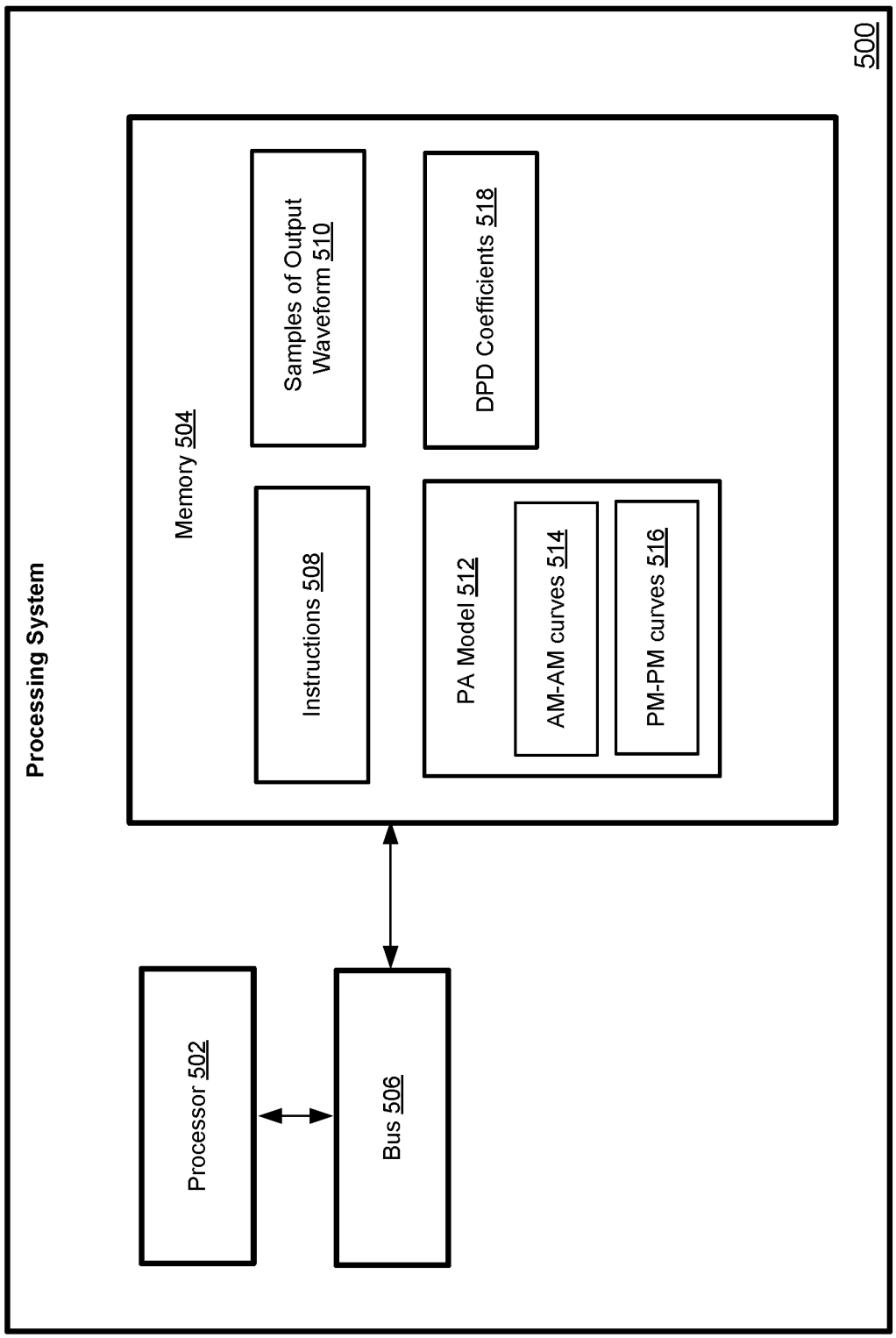
FIG. 5 is an embodiment of a processing system for determining DPD coefficients for a PA.

FIG. 5 is a block diagram of a processing system 500 for determining DPD coefficients 518 for a PA 110 according to one example of the present disclosure. An example of the processing system 500 can be processing system 112 from FIG. 1 or FIG. 2. The components shown in FIG. 5, such as a processor 502, a memory 504, a bus 506, and the like, may be integrated into a single structure such as within a single housing of the processing system 500. Alternatively, the components shown in FIG. 5 can be distributed from one another and in electrical communication with each other.

As shown, the processing system 500 includes the processor 502 communicatively coupled to the memory 504 by the bus 506. The processor 502 can include one processor or multiple processors. Non-limiting examples of the processor 502 include a Field-Programmable Gate Array (FPGA), an application specific integrated circuit (ASIC), a microprocessor, or any combination of these. The processor 502 can execute instructions 508 stored in the memory 504 to perform operations. In some examples, the instructions 508 can include processor-specific instructions generated by a compiler or an interpreter from code written in any suitable computer-programming language, such as C, C++, C #, or Java.

The memory 504 can include one memory device or multiple memory devices. The memory 504 can be non-volatile and may include any type of memory device that retains stored information when powered off. Non-limiting examples of the memory 504 include electrically erasable and programmable read-only memory (EEPROM), flash memory, or any other type of non-volatile memory. At least some of the memory 504 can include a non-transitory computer-readable medium from which the processor 502 can read instructions 508. The non-transitory computer-readable medium can include electronic, optical, magnetic, or other storage devices capable of providing the processor 502 with the instructions 508 or other program code. Non-limiting examples of the non-transitory computer-readable medium include magnetic disk(s), memory chip(s), RAM, an ASIC, or any other medium from which a computer processor can read instructions 608.

Additionally, the memory 504 can further include samples 510 of an output waveform, a PA model 512, and DPD coefficients 518. In some examples, the processing system 500 receives the samples 510 from test equipment 114 such as a VSA 420. The processing system 500 can compute the PA model 512 using the samples 510 of the output waveform. The PA model 512 can include AM-AM 514 curves that describe how a PA 110 can affect an amplitude of an input waveform and AM-PM 516 curves that describe how the PA 110 affects phase. The processing system 500 can determine the DPD coefficients 518 for a plurality of power levels based on the PA model 512. The DPD coefficients 518 can be transmitted to a transmitter system 102 and stored in a memory of a transmitter computing device 106. Transmission hardware 108 of the transmitter system 102 can add predistortions using the DPD coefficients 518 to a plurality of input waveforms to correct for impairments introduced by the PA 110. In some examples, adding the predistortions can include altering a power level or a phase of the plurality of input waveforms.

Figure 6:
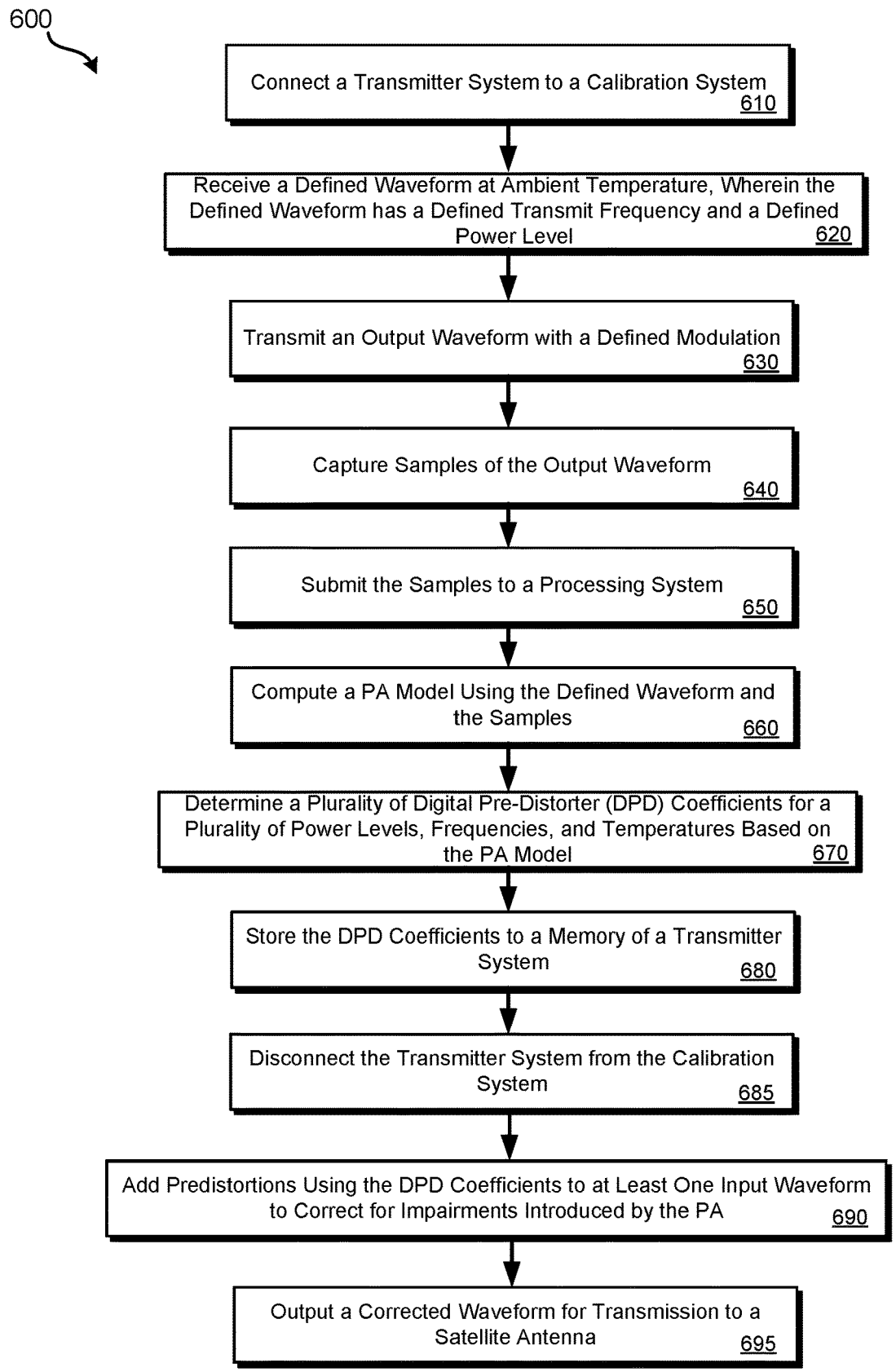
FIG. 6 is an embodiment of a method for determining DPD coefficients to compensate for PA nonlinearity.

FIG. 6 is a flowchart depicting a method 600 for determining DPD coefficients 518 to compensate for PA nonlinearity according to one example of the present disclosure. Operations of flowcharts may be performed by software, firmware, hardware, or a combination thereof. The operations of the flowchart start at block 610.

At block 610, the method 600 involves connecting a transmitter system 102 to a calibration system 104. The connection can be a temporary connection. In some examples, a processing system 112 of the calibration system 104 can be connected to the transmitter system 102 through a Multimedia over Coax Alliance (MOCA) or ethernet interface to configure transmission hardware 108 of a baseband processor 402 in the transmitter system 102. Other communication protocols can be used.

At block 620, the method 600 involves receiving a defined waveform by the transmitter system from the calibration system, wherein the defined waveform has a defined transmit frequency and defined power level. The waveform can be received at a PA 110 of a transmitter system 102 from transmission hardware 108 of the transmitter system 102. In some examples, the defined waveform is compared to a predetermined reference signal. Demodulation hardware 418 of a baseband processor 402 in the transmitter system 102 can lock on to the predetermined reference signal generated by an AWG 408. The AWG 408 can be a component of a calibration system 104 external to the transmitter system 102. In some examples, a VCO 404, as part of an FLL, can correct for any drift in frequency between the defined transmit frequency of the defined waveform and a frequency of the reference signal. In some examples, the processing system 112 of the calibration system 104 can send a command to the baseband processor 402 to begin transmission of the defined waveform.

At block 630, the method 600 involves transmitting an output waveform with a defined modulation. The output waveform can be output from the PA 110. Prior to passing through the PA 110, an operating point for the defined waveform can be identified. The operating point can be defined by an input frequency and input power of a modulated version of the defined waveform. In some examples, the modulated waveform is a 16APSK modulated waveform with a specified peak to average signal ratio to assist in an identification of nonlinearity introduced by the PA 110 when the input power of the modulated waveform is near a boundary value such as the boundary value 204 shown in FIG. 2.

At block 640, the method 600 involves capturing samples 510 of the output waveform. The samples can be captured by a VSA 420 of the calibration system 104. The VSA 420 can down convert to baseband the captured samples 510 of the output waveform. In some examples, an IQ analyzer can capture the baseband digital samples from the output waveform. In some examples, the processing system 112 can trigger the VSA 420 to capture the baseband digital samples. The trigger can be based on a sensed power level above a threshold in the VSA 420.

At block 650, the method 600 involves submitting the samples 510 to the processing system 112. The processing system 112 can be a PC of the calibration system 104. The samples 510 can be submitted from the VSA 420 to the processing system 112. The VSA 420 can be configured to communicate with the baseband processor 402.

At block 660, the method 600 involves computing a PA model 512 using the defined waveform and the samples 510. The processing system 112 can execute a program to compute the PA model 512. The processing system 112 can include at least one processor and a non-transitory computer-readable medium with instructions that are executable by a processor for causing the processor to perform operations including executing the program. Computing the PA model 512 can involve determining AM-AM 514 and AM-PM 516 curves associated with the PA 110. In some examples, the processing systems 112 can transmit the PA model 512 to the transmitter system 102.

At block 670, the method 600 involves determining a plurality of DPD coefficients 518 for a plurality of power levels, frequencies, temperatures, or some combination thereof based on the PA model 512. A portion of the plurality of power levels can be associated with a plurality of operating points for a specified frequency at ambient temperature. Ambient temperature can be around 25 degrees Celsius, such as between 15-35 degrees Celsius. Other portions of the plurality of power levels can be associated with operating points for several other frequencies. The processing system 112 can execute another program to run a simulation using the PA model 512 to generate the DPD coefficients 518 for the plurality of power levels. In some examples, at least one processor of the baseband processor 402 can determine the DPD coefficients 518.

DPD coefficients can be determined for a plurality of temperatures in addition to the ambient temperature. A temperature-based adjustment to DPD coefficients can be based on a Pulse Density Modulation (PDM) value. A hardware register in the transmission hardware 108 can be configured with the PDM value, which can be used by the transmission hardware 108 to set-up a gain in the upconverter 406. A relation between PDM value and a current temperature of the transmitter system 102 can be determined and the PDM value can be adjusted to achieve a same operating point as an operating point used at ambient temperature. The DPD coefficients for the current temperature can be determined based on the adjusted PDM value.

At block 680, the method 600 involves storing the DPD coefficients 518 to a memory of the transmitter system 102. In some examples, the processing system 112 can transmit the DPD coefficients 518 to the transmitter system 102. In some examples, the transmitter system 102 can include a temperature sensor 422 and the baseband processor 402 can adjust the DPD coefficients 518 based on a measured temperature of the transmitter system 102.

At block 685, the method 600 involves disconnecting the transmitter system 102 from the calibration system 104. Each component of the calibration system 104 can be disconnected from the transmitter system 102. These components include the processing system 112, the VSA 420, and the AWG 408.

At block 690, the method 600 involves adding predistortions using the DPD coefficients 518 to at least one input waveform to correct for impairments introduced by the PA 110. The predistortions can be added by a DPD 414 of the transmitter system 102. The predistortions can involve altering a power level, a phase, or both the power level and the phase of the at least one input waveform. In-band signal quality and ACPR can be measured from outputs from the PA associated with the at least one input waveform. The measured in-band signal quality and ACPR values can be compared to corresponding values measured when the DPD 414 is in bypass mode. The applied digital predistortions can provide improvements in in-band signal quality and ACPR.

At block 695, the method 600 involves outputting a corrected waveform, such as for transmission to a satellite antenna and to a satellite. The corrected waveform can be amplified by the PA 110 absent any nonlinear impairments or at least with reduced non-linear impairments for both amplitude and, possibly, phase. Method 600 can be repeated for additional transmitter systems using the same calibration system. Therefore, a single calibration system can be used to calibrate dozen, hundreds, or even thousands of transmitter system. Method 600 can be performed as part of the manufacturing process of transmitter systems such that when deployed to the field, transmitter systems are ready for use.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known, processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A method for predistorting an input to a power amplifier (PA), the method comprising:
    temporarily connecting a calibration system with a transmitter system, wherein the calibration system is external to the transmitter system;
    receiving, at the PA of the transmitter system, a defined waveform, wherein the defined waveform has a defined transmit frequency and a defined power level;
    outputting, by the PA, an output waveform with a defined modulation;
    while the calibration system is temporarily connected with the transmitter system:
        capturing, by the calibration system, a plurality of samples of the output waveform from the PA, wherein the calibration system is temporarily connected with the transmitter system;
        calculating, by the calibration system, a PA model based on the defined waveform and the plurality of samples;
        determining, by the calibration system, a plurality of digital pre-distorter (DPD) coefficients for a plurality of power levels, frequencies, and temperatures based on the PA model, and adjusting the plurality of DPD coefficients based on a pulse density modulation value related to a temperature of the transmitter system; and
        storing, by the transmitter system, the adjusted plurality of DPD coefficients; and
    disconnecting the calibration system from the transmitter system, and, after disconnecting the calibration system, modifying, by transmit hardware of the transmitter system, a plurality of input waveforms based at least in part on the adjusted plurality of DPD coefficients to create a predistorted waveform for input to the PA.

2. The method of claim 1, further comprising: disconnecting the transmitter system from the calibration system prior to modifying the plurality of input waveforms.

3. The method of claim 1, wherein modifying the plurality of input waveforms is performed by a DPD of the transmitter system, and wherein capturing the plurality of samples is performed at ambient temperature.

4. The method of claim 3, further comprising:
    measuring a signal to noise ratio (SNR) of at least one output waveform of the PA associated with the plurality of input waveforms;
    measuring a bypass SNR of a bypass output waveform while the DPD is in a bypass mode; and
    comparing the SNR to the bypass SNR to confirm improvement in signal quality due to modifying the plurality of input waveforms.

5. The method of claim 1, wherein modifying the plurality of input waveforms comprises altering power levels or phases of the plurality of input waveforms.

6. The method of claim 1, further comprising:
    adjusting the DPD coefficients based on a relation between the pulse density modulation value and a measured temperature of the transmitter system.

7. The method of claim 1, wherein capturing the plurality of samples of the output waveform is performed by a vector signal analyzer (VSA) external of the calibration system.

8. The method of claim 1, further comprising:
    transmitting the PA model from the calibration system to the transmitter system.

9. The method of claim 1, further comprising:
    locking on to a reference signal generated by a signal generator external to the transmitter system; and
    correcting a frequency drift between the defined transmit frequency and a frequency of the reference signal.

10. A power amplifier (PA) predistortion system comprising:
    a transmitter system, comprising:
        a power amplifier (PA) that receives a defined waveform, performs amplification, and transmit an output waveform;
        transmit hardware configured to transmit the defined waveform, wherein the defined waveform has a defined transmit frequency and a defined power level, and configured to add predistortions using a plurality of digital pre-distorter (DPD) coefficients associated with a PA model to a plurality of input waveforms to correct for impairments introduced by the PA; and a memory that stores the plurality of DPD coefficients; and a calibration system that, while temporarily connected with the transmitter system, captures samples of the output waveform from the PA, wherein the calibration system is external to the transmitter system, the calibration system comprising:

one or more processors; and a non-transitory, computer-readable medium comprising instructions that are executable by the one or more processors for causing the processor to perform operations while temporarily connected with the transmitter system, the operations comprising receiving the samples of the output waveform and computing the PA model using the defined waveform and the samples of the output waveform;

wherein the DPD coefficients are determined for a plurality of power levels, frequencies, and temperatures based on the PA model, and adjusting the plurality of DPD coefficients based on a pulse density modulation value related to a temperature of the transmitter system; and wherein the calibration system is disengaged from the transmitter system after performing the operations.

11. The PA predistortion system of claim 10, wherein the calibration system is disengaged from the transmitter system before the predistortions are added to an input waveform.

12. The PA predistortion system of claim 10, wherein the transmit hardware comprises a DPD configured to add the predistortions to the plurality of input waveforms.

13. The PA predistortion system of claim 12, wherein the calibration system is configured to measure a signal to noise ratio (SNR) of at least one output waveform of the PA and configured to compare SNR values to bypass SNR values.

14. The PA predistortion system of claim 10, wherein the transmit hardware is configured to add the predistortions to the plurality of input waveforms by altering power levels or phases of the plurality of input waveforms.

15. The PA predistortion system of claim 10, wherein the transmitter system further comprises a temperature sensor and wherein the transmitter system is configured to adjust the DPD coefficients based on a measured temperature of the transmitter system.

16. The PA predistortion system of claim 10, wherein the operations further comprise determining the plurality of DPD coefficients for a plurality of power levels based on the PA model.

17. The PA predistortion system of claim 10, wherein the operations further comprise transmitting the PA model to the transmitter system, wherein the transmitter system further comprises at least one processor configured to determine the plurality of DPD coefficients for the plurality of power levels, frequencies, and temperatures based on the PA model.

18. The PA predistortion system of claim 10, wherein the calibration system further comprises a signal generator external to the transmitter system and wherein the transmitter system is further configured to lock on to a reference signal generated by the signal generator and correct a frequency drift between the defined transmit frequency and a frequency of the reference signal.

19. A non-transitory, processor-readable medium comprising instructions that are executable by one or more processors of a calibration system removably connected with a transmitter system, causing the one or more processors of the calibration system to perform operations while temporarily connected with the transmitter system, the operations comprising:

receiving samples of an output waveform transmitted by a power amplifier (PA) of the transmitter system;

computing a PA model using a defined waveform and the samples; and determining a plurality of digital pre-distorter (DPD) coefficients for a plurality of power levels, frequencies, and temperatures based on the computed PA model, and adjusting the plurality of DPD coefficients based on a pulse density modulation value related to a temperature of the transmitter system.

20. The non-transitory, processor-readable medium of claim 19, wherein the operations further comprise transmitting the DPD coefficients to the transmitter system.

* * * * *